United States Patent
Takahashi et al.

(10) Patent No.: US 8,063,679 B2
(45) Date of Patent: Nov. 22, 2011

(54) DLL CIRCUIT AND CONTROL METHOD THEREFOR

(75) Inventors: Hiroki Takahashi, Chuo-ku (JP); Toru Ishikawa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 83 days.

(21) Appl. No.: 12/603,910

(22) Filed: Oct. 22, 2009

(65) Prior Publication Data

US 2010/0102862 A1    Apr. 29, 2010

(30) Foreign Application Priority Data

Oct. 23, 2008  (JP) ................................. 2008-273236

(51) Int. Cl.
   *H03L 7/06* (2006.01)
(52) U.S. Cl. ........................................ 327/158; 327/149
(58) Field of Classification Search .................. 327/149, 327/158
   See application file for complete search history.

(56) References Cited

U.S. PATENT DOCUMENTS

| | | | | |
|---|---|---|---|---|
| 6,987,409 B2* | 1/2006 | Kim et al. | | 327/158 |
| 7,111,185 B2* | 9/2006 | Gomm et al. | | 713/401 |
| 7,239,188 B1* | 7/2007 | Xu et al. | | 327/156 |
| 7,486,119 B2* | 2/2009 | Lee | | 327/158 |
| 2001/0028266 A1 | 10/2001 | Taniguchi | | |
| 2003/0067332 A1* | 4/2003 | Mikhalev et al. | | 327/158 |
| 2003/0128622 A1* | 7/2003 | Graaff | | 365/233 |
| 2004/0177286 A1* | 9/2004 | Gauthier et al. | | 713/401 |

FOREIGN PATENT DOCUMENTS

JP  2001-290555 A  10/2001

\* cited by examiner

*Primary Examiner* — Lincoln Donovan
*Assistant Examiner* — Adam Houston
(74) *Attorney, Agent, or Firm* — Sughrue Mion, PLLC

(57) ABSTRACT

Jitter is stably reduced. An input clock signal (CLKi) is outputted as an output clock signal (CLKo) via a voltage controlled delay circuit (12), and in addition a delay amount in the voltage controlled delay circuit (12) is controlled based on a result of a phase comparison of the input clock signal (CLKi) and the output clock signal (CLKo). A phase comparison result judging circuit (15) adds up results of phase comparison of the input clock signal (CLKi) and the output clock signal (CLKo) over a prescribed time, and controls the delay amount based on a distribution of addition results.

14 Claims, 3 Drawing Sheets

DLL CIRCUIT AND CONTROL METHOD THEREFOR

TECHNICAL FIELD

Reference to Related Application

This application is based upon and claims the benefit of the priority of Japanese patent application No. 2008-273236, filed on Oct. 23, 2008, the disclosure of which is incorporated herein in its entirety by reference thereto.

The present invention relates to a DLL (Delay Locked Loop) circuit and a control method therefor, and in particular, relates to technology for reducing jitter in a DLL circuit.

BACKGROUND

In a DLL circuit, phases of a received clock signal CLKi (reference clock) and a signal obtained by feedback of a clock signal CLKo outputted by a variable delay circuit (voltage controlled delay line or the like) are compared by a phase comparison circuit (PD), and a comparison result is reflected in delay time of the variable delay circuit. Control is performed to advance or delay the phase of the clock signal CLKo, and an operation is performed so that finally the phases of the clock signal CLKo and the clock signal CLKi match (are locked).

In this type of DLL circuit, in a case where jitter is included in the clock signal CLKi, the jitter of the clock signal CLKi is reflected also in the clock signal CLKo. That is, since the phase comparison circuit (PD) detects phase difference due to jitter of the clock signal CLKi to perform phase adjustment, with regard to the jitter of the clock signal CLKo, phase change due to the phase adjustment is added to the jitter of the clock signal CLKi.

Accordingly, Patent Document 1 discloses a DLL circuit in which, in order to reduce the jitter of the clock signal CLKo, in a case where results of a plurality of phase comparisons all match, delay time of the variable delay circuit is adjusted based on the comparison results.

[Patent Document 1]

JP Patent Kokai Publication No. JP-P2001-290555A

SUMMARY

The entire disclosure of Patent Document 1 is incorporated herein by reference thereto.

The following analysis is given by the present invention.

Jitter size, however, generally accompanies change with time. According to distribution of this jitter change, cases where all of a plurality of comparison results match, as in conventional technology, are quite limited, so that it may not be possible to sufficiently reduce the jitter. In order to avoid this, it is preferable to have relatively few of the plurality of comparison results, but in this case, with regard to the jitter of the clock signal CLKo, there is a risk that phase change due to the phase adjustment may be added to the jitter of the clock signal CLKi.

According to a first aspect of the present invention, a DLL circuit is provided with a delay circuit that gives a delay amount of a prescribed value to an input signal of a prescribed frequency received at an input terminal of the DLL circuit, to be outputted as an output signal to an output terminal of the DLL circuit. A phase comparison circuit compares phases of the input signal and the output signal and outputs, as a comparison result signal, a comparison result showing a first state in which the phase of the output signal is advanced and a second state in which the phase of the output signal is delayed in comparison to the input signal. A control circuit receives the comparison result signal as input and that controls delay amount of the delay circuit. The control circuit changes the delay amount according to the number of comparison results, which show one state of either the first state or the second state and occupy in the overall number of comparison operations executed a plurality of times by the phase comparison circuit, when the number is a prescribed number.

According to a second aspect of the present invention, there is provided a DLL circuit that outputs an input clock signal as an output clock signal via a variable delay circuit, and also controls a delay amount in the variable delay circuit based on a result of a phase comparison of the input clock signal and the output clock signal. The DLL circuit is provided with a phase comparison result judging circuit that adds up results of phase comparison of the input clock signal and the output clock signal over a prescribed time, and controls the delay amount based on a distribution of addition results.

According to a third aspect of the present invention, there is provided a control method of a DLL circuit that outputs an input clock signal as an output clock signal via a variable delay circuit, in addition to performing a phase comparison of the input clock signal and the output clock signal, and controlling a delay amount in the variable delay circuit based on a result of the phase comparison. The method includes adding up results of phase comparison of the input clock signal and the output clock signal over a prescribed time; and controlling the delay amount based on a distribution of addition results.

The meritorious effects of the present invention are summarized as follows.

According to the present invention, it is possible to stably reduce jitter, since reaction to a phase shift due to noise does not easily occur.

PREFERRED MODES

Figure 1:
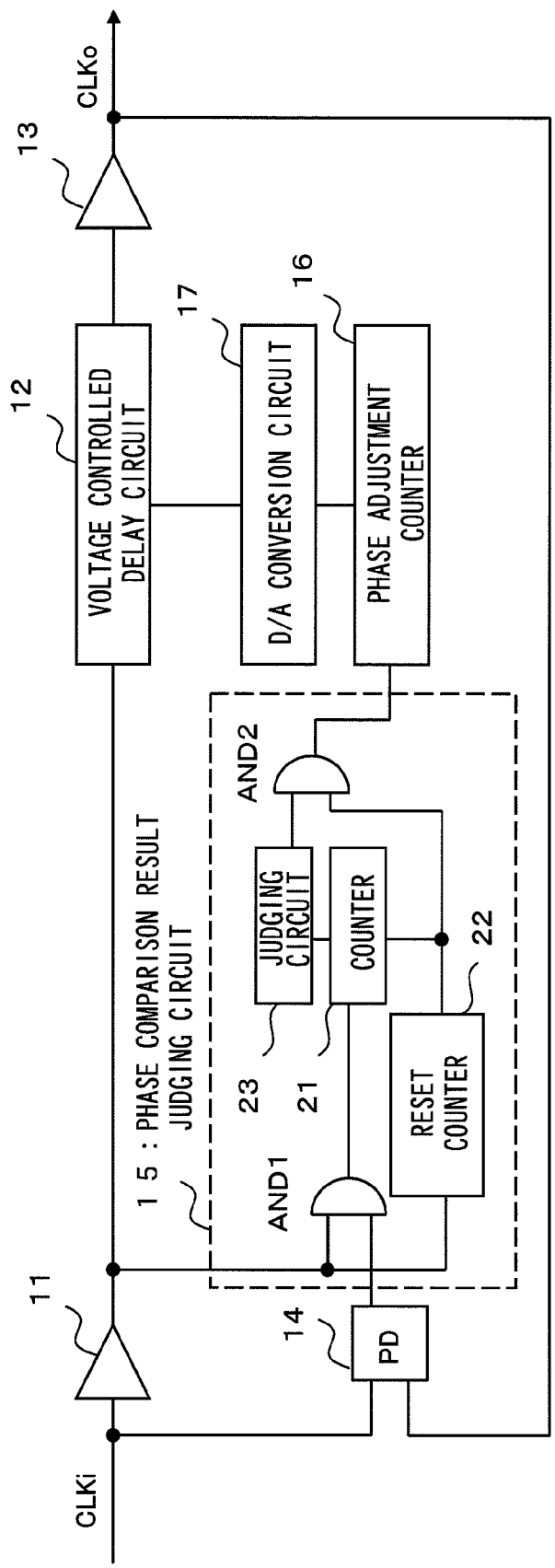
FIG. 1 is a block diagram showing a configuration of a DLL circuit according to an exemplary embodiment of the present invention.

A DLL circuit according to an exemplary mode of the present invention is provided with a delay circuit (a voltage controlled delay circuit 12 in FIG. 1) that gives a delay amount of a prescribed value to an input signal (CLKi in FIG. 1) of a prescribed frequency received at an input terminal of the DLL circuit, to be outputted as an output signal (CLKo in FIG. 1) to an output terminal of the DLL circuit, a phase comparison circuit (14 in FIG. 1) that compares phases of the input signal and the output signal and outputs, as a comparison result signal, a comparison result showing a first state in which the phase of the output signal is advanced in comparison to the input signal, and a second state in which the phase of the output signal is delayed in comparison to the input signal, and a control circuit (15 in FIG. 1) that receives the comparison result signal as input and that controls delay amount of the delay circuit, wherein the control circuit changes the delay amount according to the number of comparison results, which shows one state of either the first state or the second state and occupies in the overall number of comparison operations executed a plurality of times by the phase comparison circuit, the number of comparison results being a prescribed number.

The DLL circuit according to the exemplary mode of the present invention is a circuit that outputs the input clock signal (CLKi in FIG. 1) as an output clock signal (CLKo in FIG. 1) via a variable delay circuit (a voltage controlled delay circuit 12 in FIG. 1), and also controls a delay amount in the variable delay circuit based on a result of a phase comparison of the input clock signal and the output clock signal, and is provided with a phase comparison result judging circuit (15 in FIG. 1) that adds up (sums up) results of phase comparison of the input clock signal and the output clock signal over a prescribed time, and controls delay amount based on a distribution of addition results.

When the phase comparison result judging circuit adds up results of phase comparison showing that the phase of the output clock signal is advanced compared to the input clock signal, in a case where the addition result is greater than or equal to a first threshold, the phase comparison result judging circuit preferably increases the delay amount, and in a case where the addition result is less than or equal to a second threshold smaller than the first threshold, the phase comparison result judging circuit preferably decreases the delay amount.

Furthermore, when the phase comparison result judging circuit adds up results of phase comparison showing that the phase of the output clock signal is delayed compared to the input clock signal, in a case where the addition result is greater than or equal to the first threshold, the phase comparison result judging circuit preferably decreases the delay amount, and in a case where the addition result is less than or equal to a second threshold smaller than the first threshold, the phase comparison result judging circuit preferably increases the delay amount.

A phase adjustment counter (16 in FIG. 1) may be provided, which counts a count value for controlling the delay amount in the variable delay circuit, and the phase adjustment counter may increase or decrease the count value based on a result of comparison of the addition result and the first and second thresholds.

According to the above type of DLL circuit, since the delay amount can be increased or decreased based on a distribution of addition results of the phase comparison results, reaction to a phase shift due to noise in the input clock signal does not easily occur, and it is possible to stably reduce jitter.

A detailed description is given below according to an exemplary embodiment, making reference to the drawings.

Exemplary Embodiment 1

FIG. 1 is a block diagram showing a configuration of a DLL circuit according to an exemplary embodiment of the present invention. In FIG. 1, the DLL circuit is provided with an input buffer 11, a voltage controlled delay circuit (VCDL) 12, an output buffer 13, a phase comparison circuit (PD) 14, a phase comparison result judging circuit 15, a phase adjustment counter 16, and a D/A conversion circuit 17.

The input buffer 11 receives as input a clock signal CLKi from outside, and outputs to the voltage controlled delay circuit 12 and the phase comparison result judging circuit 15. Furthermore, the clock signal CLKi is also inputted to one input terminal of the phase comparison circuit 14. The voltage controlled delay circuit 12, being a variable delay circuit that controls delay amount based on an output signal of the D/A conversion circuit 17, delays the output signal of the input buffer 11, and outputs to the output buffer 13. The output buffer 13 performs buffering of the output signal of the voltage controlled delay circuit 12, and outputs the output signal to the outside as a clock signal CLKo in addition to outputting to another input terminal of the phase comparison circuit 14.

The phase comparison circuit 14 compares phases of the clock signal CLKi and the clock signal CLKo, and outputs a comparison result to the phase comparison result judging circuit 15. The phase comparison result judging circuit 15 counts phase comparison results over a plurality of cycles, obtains an accumulation (summation) of the phase comparison results, and outputs a comparison result of whether or not an accumulated value has changed a prescribed threshold, to the phase adjustment counter 16.

The phase adjustment counter 16 counts the comparison results, and the D/A conversion circuit 17 performs D/A conversion on a count result to be given to the voltage controlled delay circuit so as to control the delay amount in the voltage controlled delay circuit 12.

Next, a detailed description is given concerning the phase comparison result judging circuit 15. The phase comparison result judging circuit 15 is provided with AND circuits AND1 and AND2, a counter 21 for a phase comparison result equivalent to a second counter, a reset counter 22 equivalent to a first counter, and a judging circuit 23 for a counter value. After a phase lock by a prescribed operation in the DLL circuit is completed, the counter 21 receives and counts, via the AND circuit AND1, a phase comparison result (phase Up or phase Down) of the phase comparison circuit 14, over a predetermined plurality of cycles (with a time-period). The AND circuit AND1 outputs to the counter 21 only a phase comparison result in a case where the output signal of the input buffer 11 is at a H level.

The judging circuit 23 outputs a judgment result of the phase comparison of: a phase Down (or a phase Up) when a phase Up (or Down) signal exists in, for example, less than 25% of a plurality of cycles, a phase HOLD (phase is not shifted) for a case of 25% to 75%, and a phase Up (or a phase Down) for more than 75%. A reset counter 22 resets the counter 21 by counting output signals of the input buffer 11 to create a time-period of the predetermined plurality of cycles described above. Furthermore, at the same time by making a gate active by the AND circuit AND 2, a judgment result of the judging circuit 23 is outputted to the phase adjustment counter 16 via the AND circuit AND2.

Figure 2:
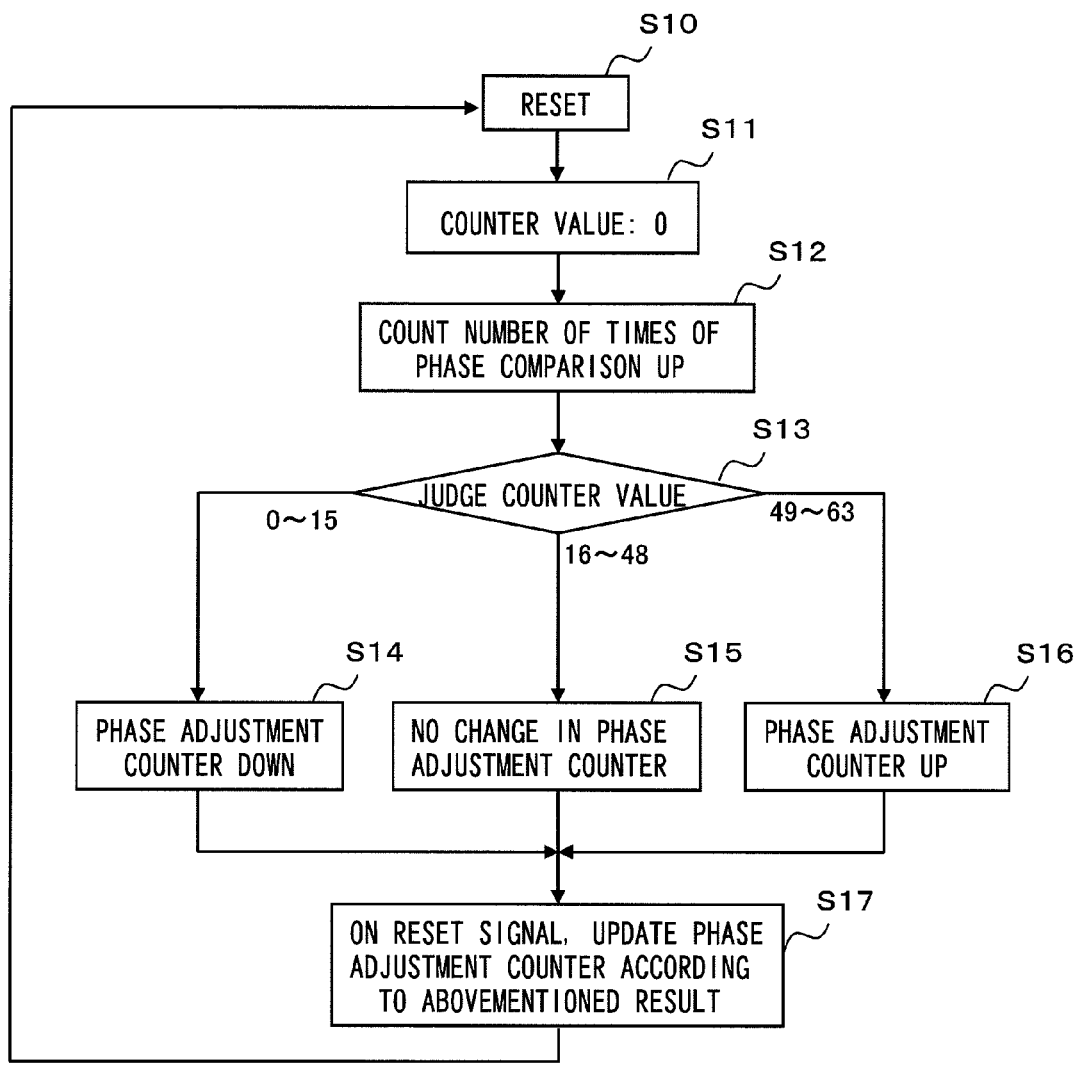
FIG. 2 is a flowchart representing operation of the phase comparison result judging circuit according to the exemplary embodiment of the present invention.

FIG. 2 is a flowchart representing operation of the phase comparison result judging circuit according to the exemplary embodiment of the present invention. Here, as one example, the counter 21 is a sexadecimal counter, and counts phase Up, which is a phase comparison result, in a range of 0 to 63.

In step S10, the counter 21 is reset by a reset signal from a reset counter 22 and a counter value is 0 (step S11).

In step S12, the counter 21 counts the number of occurrences of the phase Up (phase comparison Up), and in step S13 the count is ended, and the judging circuit 23 performs a judgment of the count value.

If the result of the judgment of the count value is that of 0 to 15 occurrences of an Up judgment, that is 75% or more occurrences of a Down judgment, the judging circuit 23 outputs a judgment result to make the phase adjustment counter 16 count down (step S14). Furthermore, if there are 49 to 63 occurrences of an Up judgment, that is, if there are 75% or more occurrences of an Up judgment, a judgment result is outputted to make the phase adjustment counter 16 count up (step S16). In addition, if there are 16 to 48 occurrences of an Up judgment, a judgment result is outputted so as not to operate the phase adjustment counter 16, determined as there is no large difference among Up and Down judgments.

In step S17, a reset signal is outputted by the reset counter 22, the phase adjustment counter 16 operates according to the abovementioned judgment result, and processing returns to step S10.

Figure 3:
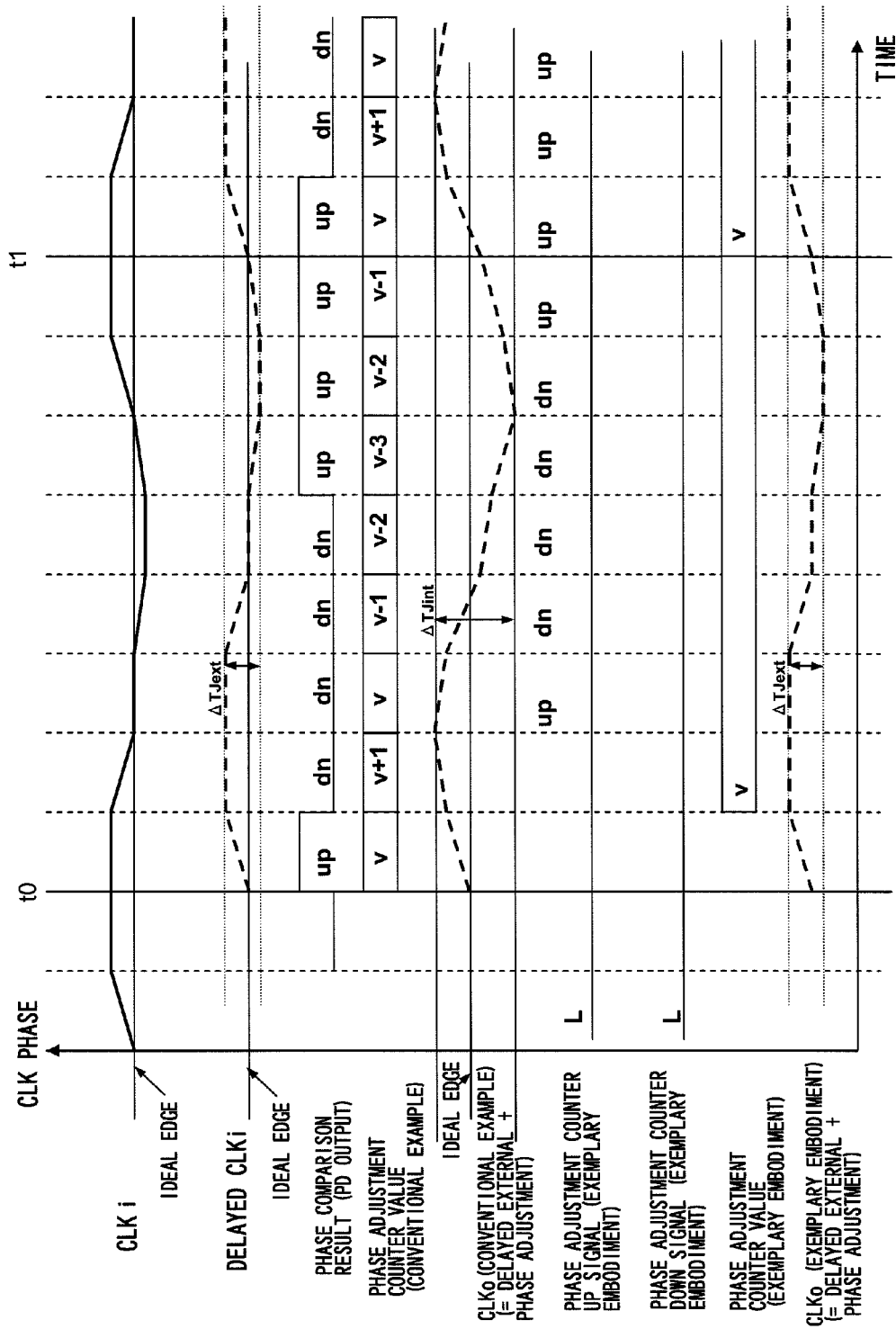
FIG. 3 is a timing chart representing operation of the DLL circuit according to the exemplary embodiment of the present invention.

FIG. 3 is a timing chart representing operation of the DLL circuit according to the exemplary embodiment of the present invention. FIG. 3 shows an operation waveform focused on jitter of a rising edge of the clock signal CLKi after the DLL circuit is locked. For drawing simplification here, an example is used in which the counter 21 is an octal counter. If jitter exists in the clock signal CLKi, as shown in the waveform of the clock signal CLKi, a time shift (jitter) of $\Delta T$ from an ideal edge occurs. Since this time shift $\Delta T$ may change with each cycle, its waveform becomes as that of the clock signal CLKi, and a peak amount of the jitter is taken as $\Delta TJext$.

A description is given here concerning operation after timing t0. The phase comparison circuit 14 compares phases of the clock signal CLKi, and the clock signal CLKo, which is the clock signal CLKi+phase adjustment result, and outputs a phase comparison result (PD output) of phase Down or phase Up. In the example using the octal counter, output of the phase comparison circuit 14 is counted for each cycle by the counter 21, and distribution of 8-cycle phase comparison results is judged by the judging circuit 23. In the example of FIG. 3, since an Up judgment at timing of t1 is 50% (i.e., number of up judgment times between t0-t1 is 4 relative to the whole judgment times 8), the judgment is phase-hold, both Up signal and Down signal of the phase adjustment counter are "L", and a phase adjustment counter value is held as it is, at a value of v. As a result, when the phase comparison result judging circuit 15 is not provided (in a conventional example), the peak amount of jitter of the clock signal CLKo increases to $\Delta TJint$, whereas by providing the phase comparison result judging circuit 15, the peak amount of jitter of the clock signal CLKo is reduced to $\Delta TJext$. The counter 21 is reset for each 8-cycle.

According to the above type of DLL circuit, by making a determination from distribution of additions (summation) of the phase comparison results of the phase comparison circuit 14 to make a judgment of Up/Down for the phase adjustment counter 16, since reaction to a phase shift due to noise does not occur easily, it is possible to maintain an average edge position. The counter 21 is used here in a judgment method, and an Up/Down operation is performed on the phase adjustment counter 16 based on a value of the counter 21 in a certain fixed time-period. This judgment value can also be made programmable, and adjustment for each system is possible.

In the DLL circuit of the present invention, the counter of the phase comparison results may have a multi-stage configuration, and may be configured so that the number of cycles of phase comparison result judgment is variable. Furthermore, a configuration is also possible where the threshold of distribution at which phase adjustment is performed is variable.

In addition, a configuration applied to a falling edge of the clock signal CLKi is also possible. Furthermore, a configuration applied to both a rising and a falling edge of the clock signal CLKi is also possible.

In a case where jitter exists in the clock signal CLKi as described above, by performing phase adjustment of the clock CLKo based on distribution of the phase comparison results within a fixed plural number of cycles, an effect of phase change due to jitter within the plural cycles is filtered. As a result, the jitter amount of the clock signal CLKo no longer exceeds $\Delta TJext$, which is a peak value of the jitter of the clock signal CLKi.

The DLL circuit of the present invention can be installed in various types of semiconductor device. With regard to semiconductor devices, the present invention can be applied generally to semiconductor products such as a CPU (Central Processing Unit), an MCU (Micro Control Unit), a DSP (Digital Signal Processor), an ASIC (Application Specific Integrated Circuit), an ASSP (Application Specific Standard Circuit) and the like. With regard to devices to which the present application is applied, application is possible to semiconductor devices such as a SOC (system-on-chip), MCP (multi-chip package), POP (package-on-package) and the like. Furthermore, circuit form of the input buffer, the voltage controlled delay circuit, the phase adjustment circuit, the output buffer, the D/A conversion circuit, the counter, the judging circuit and the like can be arbitrarily designed for respective characteristic objectives. The phase comparison result judging circuit is not limited to a circuit configuration disclosed in the exemplary embodiment. The reset counter can realize a prescribed time by a timer configured by an oscillator or the like. Inclusion of a counter in a timer is well known.

The clock signal CLKi of the DLL circuit of the present invention is received (inputted) at an input terminal of the DLL circuit, and the output clock signal CLKo is outputted at an output terminal of the DLL circuit. The input terminal of the DLL circuit may be an external terminal of a semiconductor device. The external terminal of the DLL circuit is connected to a synchronization control terminal of an internal circuit connected to an output terminal of the semiconductor device. The internal circuit outputs an internal signal at (to) the output terminal according to the output clock signal CLKo. Thus, the internal signal outputted at (to) the output terminal is a signal synchronous (having a matching phase) with the clock signal CLKi controlled by the semiconductor device.

The various disclosures of the abovementioned Patent Documents are incorporated herein by reference thereto. Modifications and adjustments of embodiments and examples are possible within the bounds of the entire disclosure (including the scope of the claims) of the present invention, and also based on fundamental technological concepts thereof. Furthermore, a wide variety of combinations and selections of various disclosed elements are possible within the scope of the claims of the present invention. That is, the present invention clearly includes every type of transformation and modification that a person skilled in the art can realize according to technological concepts and the entire disclosure including the scope of the claims.

Possible modes based on the present invention are disclosed below.

Mode 1: This is according to the abovementioned first aspect of the invention.

Mode 2: The control circuit preferably includes first to third control operations with regard to the delay circuit, wherein the first control operation controls one operation of either increasing or decreasing the delay amount in response to the prescribed number being a first number; the second control operation holds present delay amount without changing the delay amount in response to the prescribed number being a second number larger than the first number, and the third control operation controls the other operation of the either of increasing and decreasing the delay amount in response to the prescribed number being a third number larger than the second number.

Mode 3: The control circuit preferably executes the first to the third control operations in a state in which phases of the input signal and the output signal match.

Mode 4: The control circuit preferably includes a first counter that determines the overall number of the comparison operations.

Mode 5: The first counter preferably counts transitions of the input signal.

Mode 6: The control circuit preferably includes a second counter that counts the comparison results, and a judging circuit that determines the first to the third control operations based on a value shown by the second counter, wherein the first counter resets history of the second counter and the judging circuit.

Mode 7: This is according to the abovementioned second aspect of the invention.

Mode 8: When the phase comparison result judging circuit adds up the results of the phase comparison showing that the phase of the output clock signal is advanced compared to the input clock signal, in a case where the addition result is greater than or equal to the first threshold, the phase comparison result judging circuit preferably increases the delay amount, and in a case where the addition result is less than or equal to a second threshold smaller than the first threshold, the phase comparison result judging circuit preferably decreases the delay amount.

Mode 9: In a case where the addition result is a value smaller than the first threshold and larger than the second threshold, the addition result preferably does not change the delay amount and holds the present delay amount.

Mode 10: When the phase comparison result judging circuit adds up the results of the phase comparison showing that the phase of the output clock signal is delayed compared to the input clock signal, in a case where the addition result is greater than or equal to the first threshold, the phase comparison result judging circuit preferably decreases the delay amount, and in a case where the addition result is less than or equal to a second threshold smaller than the first threshold, the phase comparison result judging circuit preferably increases the delay amount.

Mode 11: In a case where the addition result is a value smaller than the first threshold and larger than the second threshold, the addition result preferably does not change the delay amount and holds the present delay amount.

Mode 12: There is preferably provided a phase adjustment counter that counts a count value for controlling delay amount in the variable delay circuit, and the phase adjustment counter preferably increases or decreases the count value based on a result of comparison of the addition result and the first and second thresholds.

Mode 13: There is preferably provided a phase adjustment counter that counts a count value for controlling delay amount in the variable delay circuit, and the phase adjustment counter preferably increases or decreases the count value based on a result of comparison of the addition result and the first and second thresholds.

Mode 14: The phase comparison result judging circuit preferably controls the delay amount based on a distribution of addition results, in a state in which phases of the input clock signal and the output clock signal match.

Mode 15: This is the control method of a DLL circuit according to the abovementioned third aspect of the invention.

Mode 16: In the method, the addition preferably includes counting any one of the phase comparison results showing a first state in which the phase of the output clock signal is advanced in comparison to the input clock signal, and a second state in which the phase of the output clock signal is delayed, and the distribution preferably shows a ratio of counted numerical values that occupy in the overall number of the phase comparisons.

Mode 17: In the method, an operation of controlling the delay amount preferably controls one operation of either increasing or decreasing the delay amount in response to the ratio being a first number, holds the present delay amount without changing the delay amount in response to the ratio being a second number larger than the first number, and controls the other operation of either increasing or decreasing the delay amount in response to the ratio being a third number larger than the second number.

Mode 18: In the method, an operation of controlling the delay amount preferably performs the addition and executes control of the delay amount, in a state in which the phases of the input clock signal and the output clock signal match.

What is claimed is:

1. A DLL circuit comprising:
a delay circuit that gives a delay amount of a prescribed value to an input signal of a prescribed frequency received at an input terminal of said DLL circuit, to be outputted as an output signal at an output terminal of said DLL circuit;
a phase comparison circuit that compares phases of said input signal and said output signal, and outputs, as a comparison result signal, a comparison result showing a first state in which said phase of said output signal is advanced in comparison to said input signal and a second state in which said phase of said output signal is delayed in comparison to said input signal; and
a control circuit that receives said comparison result signal as input and that controls delay amount of said delay circuit;
wherein said control circuit changes said delay amount according to a number of comparison results, which show one state of either said first state and said second state, said number of comparison results being a number occupying in an overall number of comparison operations executed a plurality of times by said phase comparison circuit, being a prescribed number,
wherein said control circuit includes first to third control operations with regard to said delay circuit,
said first control operation controls one of either of increasing and decreasing said delay amount in response to said prescribed number being a first number,
said second control operation holds present delay amount without changing said delay amount in response to said prescribed number being a second number larger than said first number, and
said third control operation controls another of said either of increasing and decreasing said delay amount in response to said prescribed number being a third number larger than said second number.

2. The DLL circuit according to claim 1, wherein said control circuit executes said first to said third control operations in a state in which said phases of said input signal and said output signal match.

3. The DLL circuit according to claim 1, wherein said control circuit includes a first counter that determines said overall number of said comparison operations.

4. The DLL circuit according to claim 3, wherein said first counter counts transitions of said input signal.

5. The DLL circuit according to claim 3, wherein said control circuit includes a second counter that counts said comparison results, and a judging circuit that determines said first to said third control operations based on a value shown by said second counter, and said first counter resets history of said second counter and said judging circuit.

6. A DLL circuit that outputs an input clock signal as an output clock signal via a variable delay circuit, and controls a delay amount in said variable delay circuit based on a result of a phase comparison of said input clock signal and said output clock signal, said DLL circuit comprising:
a phase comparison result judging circuit that adds up results of phase comparison of said input clock signal and said output clock signal over a prescribed time, and controls said delay amount based on an addition result distribution,
wherein, when said phase comparison result judging circuit adds up said results of said phase comparison showing that said phase of said output clock signal is advanced compared to said input clock signal, in a case where said addition result is greater than or equal to a first threshold, said phase comparison result judging circuit increases said delay amount, and in a case where said addition result is less than or equal to a second threshold smaller than said first threshold, said phase comparison result judging circuit decreases said delay amount.

7. The DLL circuit according to claim 6, wherein, in a case where said addition result is a value smaller than said first threshold and larger than said second threshold, said addition result does not change said delay amount and holds present delay amount.

8. A DLL circuit that outputs an input clock signal as an output clock signal via a variable delay circuit, and controls a delay amount in said variable delay circuit based on a result of a phase comparison of said input clock signal and said output clock signal, said DLL circuit comprising:
a phase comparison result judging circuit that adds up results of phase comparison of said input clock signal and said output clock signal over a prescribed time, and controls said delay amount based on an addition result distribution,
wherein, when said phase comparison result judging circuit adds up said results of said phase comparison showing that said phase of said output clock signal is delayed compared to said input clock signal, in a case where said addition result is greater than or equal to a first threshold, said phase comparison result judging circuit decreases said delay amount, and in a case where said addition result is less than or equal to a second threshold smaller than said first threshold, said phase comparison result judging circuit increases said delay amount.

9. The DLL circuit according to claim 8, wherein, in a case where said addition result is a value smaller than said first threshold and larger than said second threshold, said addition result does not change said delay amount and holds present delay amount.

10. The DLL circuit according to claim 6, comprising a phase adjustment counter that counts a count value for controlling delay amount in said variable delay circuit, wherein said phase adjustment counter increases and decreases said count value based on a result of comparison of said addition result and said first and second thresholds.

11. The DLL circuit according to claim 8, comprising a phase adjustment counter that counts a count value for controlling delay amount in said variable delay circuit, wherein said phase adjustment counter increases and decreases said count value based on a result of comparison of said addition result and said first and second thresholds.

12. A DLL circuit that outputs an input clock signal as an output clock signal via a variable dela circuit based on a result of a base comparison of said input clock signal and said output clock signal, said DLL circuit comprising:
a phase comparison result judging circuit that adds up results of phase comparison of said input clock signal and said output clock signal over a prescribed time, and controls said delay amount based on an addition result distribution,
wherein said phase comparison result judging circuit controls said delay amount based on said addition result distribution, in a state in which phases of said input clock signal and said output clock signal match.

13. A control method of a DLL circuit that outputs an input clock signal as an output clock signal via a variable delay circuit, in addition to performing a phase comparison and said output clock signal, and controlling a delay amount in said variable delay circuit based on a result of said phase comparison, said method comprising:
adding up results of phase comparison of said input clock signal and said output clock signal over a prescribed time; and
controlling said delay amount based on a distribution of results of said addition,
wherein said addition includes counting any one of said phase comparison results showing a first state in which a phase of said output clock signal is advanced in comparison to said input clock signal, and a second state in which said phase of said output clock signal is delayed in comparison to said input clock signal,
said distribution shows a ratio of counted numerical values that occupy in an overall number of said phase comparisons, and
wherein an operation of controlling said delay amount controls one of either of increasing and decreasing said delay amount in response to said ratio being a first number, holds present delay amount without changing said delay amount in response to said ratio being a second number larger than said first number, and controls another of either of increasing and decreasing said delay amount in response to said ratio being a third number larger than said second number.

14. A control method of a DLL circuit that outputs an input clock signal as an output clock signal via a variable delay circuit, in addition to performing a phase comparison of said input clock signal and said output clock signal, and controlling a delay amount in said variable delay circuit based on a result of said phase comparison, said method comprising:
adding up results of phase comparison of said input clock signal and said output clock signal over a prescribed time; and
controlling said delay amount based on a distribution of results of said addition,
wherein an operation of controlling said delay amount performs said addition and executes control of said delay amount, in a state in which phases of said input clock signal and said output clock signal match.

* * * * *